(12) United States Patent
Chih et al.

(10) Patent No.: US 12,051,466 B2
(45) Date of Patent: *Jul. 30, 2024

(54) MEMORY CELL INCLUDING PROGRAMMABLE RESISTORS WITH TRANSISTOR COMPONENTS

(71) Applicant: Taiwan Semiconductor Manufacturing Company, Ltd., Hsinchu (TW)

(72) Inventors: Yu-Der Chih, Hsinchu (TW); Jonathan Tsung-Yung Chang, Hsinchu (TW); Yun-Sheng Chen, Hsinchu (TW); Maybe Chen, Hsinchu (TW); Ya-chin King, Hsinchu (TW); Wen Zhang Lin, Hsinchu (TW); Chrong Jung Lin, Hsinchu (TW); Hsin-Yuan Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/301,745

(22) Filed: Apr. 17, 2023

(65) Prior Publication Data
US 2023/0253040 A1    Aug. 10, 2023

Related U.S. Application Data

(63) Continuation of application No. 17/337,781, filed on Jun. 3, 2021, now Pat. No. 11,646,079.
(Continued)

(51) Int. Cl.
*G11C 11/00* (2006.01)
*G11C 13/00* (2006.01)
(Continued)

(52) U.S. Cl.
CPC ........ *G11C 13/004* (2013.01); *G11C 13/0069* (2013.01); *H10B 63/30* (2023.02);
(Continued)

(58) Field of Classification Search
CPC ................ G11C 13/04; G11C 13/0069; G11C 2013/0045; G11C 2013/0078; H10N 70/253; H10N 63/30
See application file for complete search history.

(56) References Cited

U.S. PATENT DOCUMENTS 6,587,370 B2    7/2003  Hirai
7,057,922 B2    6/2006  Fukumoto
(Continued)

OTHER PUBLICATIONS

Notice of Allowance on U.S. Appl. No. 17/337,781 DTD Jan. 5, 2023.

*Primary Examiner* — Viet Q Nguyen
(74) *Attorney, Agent, or Firm* — FOLEY & LARDNER LLP

(57) ABSTRACT

Disclosed herein are related to a memory cell including one or more programmable resistors and a control transistor. In one aspect, a programmable resistor includes a gate structure and one or more source/drain structures for forming a transistor. A resistance of the programmable resistor may be set by applying a voltage to the gate structure, while the control transistor is enabled. Data stored by the programmable resistor can be read by sensing current through the programmable resistor, while the control transistor is disabled. In one aspect, the one or more programmable resistors and the control transistor are implemented by same type of components, allowing the memory cell to be formed in a compact manner through a simplified the fabrication process.

20 Claims, 17 Drawing Sheets

Related U.S. Application Data

(60) Provisional application No. 63/070,733, filed on Aug. 26, 2020.

(51) Int. Cl.
*H10B 63/00* (2023.01)
*H10N 70/20* (2023.01)

(52) U.S. Cl.
CPC ... *H10N 70/253* (2023.02); *G11C 2013/0045* (2013.01); *G11C 2013/0078* (2013.01)

(56) References Cited

U.S. PATENT DOCUMENTS

| | | | |
|---|---|---|---|
| 7,061,796 B2 | 6/2006 | Hidaka | |
| 7,151,698 B2 * | 12/2006 | Baker | G11C 11/16 365/233.14 |
| 7,391,639 B2 * | 6/2008 | Gogl | G11C 13/0026 365/205 |
| 7,692,949 B2 | 4/2010 | Nirschl | |
| 7,869,249 B2 * | 1/2011 | Hush | G11C 7/062 365/100 |
| 7,924,600 B2 | 4/2011 | Ho et al. | |
| 8,335,103 B2 * | 12/2012 | Lankhorst | G11C 13/0004 365/158 |
| 8,619,450 B2 | 12/2013 | Hamilton | |
| 9,178,000 B1 | 11/2015 | Nardi et al. | |
| 9,349,440 B1 * | 5/2016 | Ma | G11C 13/0069 |
| 9,390,779 B2 * | 7/2016 | Jung | G11C 13/004 |
| 9,431,106 B1 * | 8/2016 | Roy | G11C 13/0002 |
| 9,530,501 B2 * | 12/2016 | Pelley | G11C 13/0069 |
| 9,548,116 B2 * | 1/2017 | Roy | G11C 13/0097 |
| 9,659,646 B1 * | 5/2017 | Asnaashari | G11C 13/0002 |
| 9,792,981 B2 * | 10/2017 | Pelley | G11C 13/0007 |
| 9,928,892 B2 | 3/2018 | Seo et al. | |
| 10,424,379 B2 | 9/2019 | Slesazeck et al. | |
| 10,635,398 B2 * | 4/2020 | Lin | G06F 7/5443 |
| 10,666,262 B2 | 5/2020 | Wang | |
| 11,189,661 B2 | 11/2021 | Reznicek et al. | |
| 11,232,824 B1 | 1/2022 | Gong et al. | |
| 11,646,079 B2 * | 5/2023 | Chih | H10N 70/253 365/148 |
| 2002/0005796 A1 | 1/2002 | Tran et al. | |
| 2009/0250735 A1 | 10/2009 | Asao | |
| 2014/0268989 A1 | 9/2014 | Hong et al. | |
| 2019/0326288 A1 | 10/2019 | Hashemi et al. | |
| 2022/0189543 A1 | 6/2022 | Hekmatshoartabari et al. | |

* cited by examiner

MEMORY CELL INCLUDING PROGRAMMABLE RESISTORS WITH TRANSISTOR COMPONENTS

CROSS-REFERENCE TO RELATED APPLICATIONS

This application is a continuation application of U.S. Utility application Ser. No. 17/337,781, filed Jun. 3, 2021, which claims priority to and the benefit of U.S. Provisional Application No. 63/070,733, filed Aug. 26, 2020, the entire contents of both of which are incorporated herein by reference for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
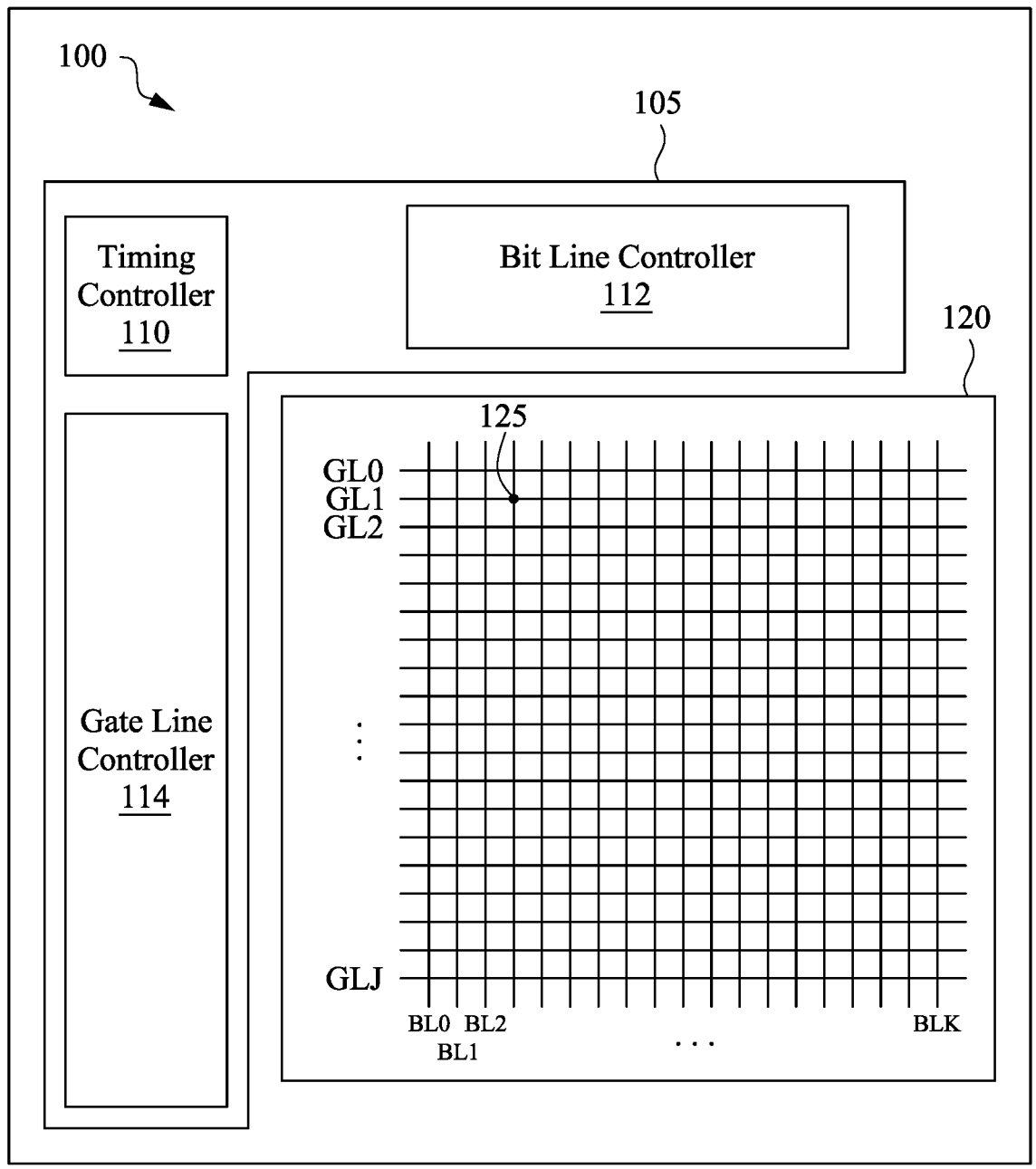
FIG. 1 is a diagram of a memory system, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory cell includes one or more programmable resistors and a control transistor. In one aspect, a programmable resistor includes a gate structure and one or more source/drain structures for forming a transistor. Each programmable resistor may store one bit data. A resistance of the programmable resistor may be set by applying a voltage to the gate structure, while the control transistor is enabled. Data stored by the programmable resistor can be read by sensing current through the programmable resistor, while the control transistor is disabled.

In one aspect, the programmable resistors and the control transistor are implemented by the same type of components to achieve various advantages. For example, the programmable resistors and the control transistor include components such as gate structures and source/drain structures for forming transistors (e.g., metal-oxide-semiconductor field effect transistor (MOSFET). By implementing the programmable resistors and the control transistor by the same type of components, a fabrication process for forming a memory cell can be simplified. Moreover, by implementing the memory cell including programmable resistors and a control transistor, the memory cell can be implemented in a reduced area with a compact form.

FIG. 1 is a diagram of a memory system 100, in accordance with one embodiment. In some embodiments, the memory system 100 is implemented as an integrated circuit.

In some embodiments, the memory system 100 includes a memory controller 105 and a memory array 120. The memory array 120 may include a plurality of storage circuits or memory cells 125 arranged in two- or three-dimensional arrays. Each memory cell 125 may be connected to a corresponding gate line GL and a corresponding bit line BL. Each gate line GL may include any conductive material. The memory controller 105 may write data to or read data from the memory array 120 according to electrical signals through gate lines GL and bit lines BL. In other embodiments, the memory system 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. In some embodiments, the memory array 120 includes gate lines GL0, GL1 . . . GLJ, each extending in a first direction (e.g., X-direction) and bit lines BL0, BL1 . . . BLK, each extending in a second direction (e.g., Y-direction). The gate lines GL and the bit lines BL may be conductive metals or conductive rails. Each gate line GL may include a word line and control lines. In one aspect, each memory cell 125 is connected to a corresponding gate line GL and a corresponding bit line BL, and can be operated according to voltages or currents through the corresponding gate line GL and the corresponding bit line BL. In one aspect, each memory cell 125 may be a non-volatile memory cell including two or more programmable resistors and a control transistor. The two or more programmable resistors and the control transistor may be embodied as components for forming a transistor (e.g., MOSFET, fin field effective transistor (Fin-FET), gate all around field effect transistor (GAAFET), or any transistor). In some embodiments, the memory array 120 includes additional lines (e.g., sense lines, reference lines, reference control lines, power rails, etc.) not shown for simplicity.

The memory controller 105 is a hardware component that controls operations of the memory array 120. The memory controller 105 may be embodied as a digital logic circuit, state machine, field programmable gate array, application specific integrated circuit, or any combination of them. In some embodiments, the memory controller 105 includes a bit line controller 112, a gate line controller 114, and a timing controller 110. In one configuration, the gate line controller 114 is a circuit that provides a voltage or a current through one or more gate lines GL of the memory array 120. In one aspect, the bit line controller 112 is a circuit that provides a voltage or current through one or more bit lines BL of the memory array 120 and senses a voltage or current from the memory array 120 through one or more sense lines. In one configuration, the timing controller 110 is a circuit that provides control signals or clock signals to the gate line controller 114 and the bit line controller 112 to synchronize operations of the bit line controller 112 and the gate line controller 114. The bit line controller 112 may be connected to bit lines BL and sense lines of the memory array 120, and the gate line controller 114 may be connected to gate lines GL of the memory array 120. In one example, to write data to a memory cell 125, the gate line controller 114 applies a voltage or current to the memory cell 125 through a gate line GL connected to the memory cell 125, and the bit line controller 112 applies a voltage or current corresponding to data to be stored to the memory cell 125 through a bit line BL connected to the memory cell 125. In one example, to read data from a memory cell 125, the gate line controller 114 provides a voltage or a current to the memory cell 125 through a gate line GL connected to the memory cell 125, and the bit line controller 112 senses a voltage or current corresponding to data stored by the memory cell 125 through a sense line connected to the memory cell 125. In some embodiments, the memory controller 105 includes more, fewer, or different components than shown in FIG. 1.

Figure 2:
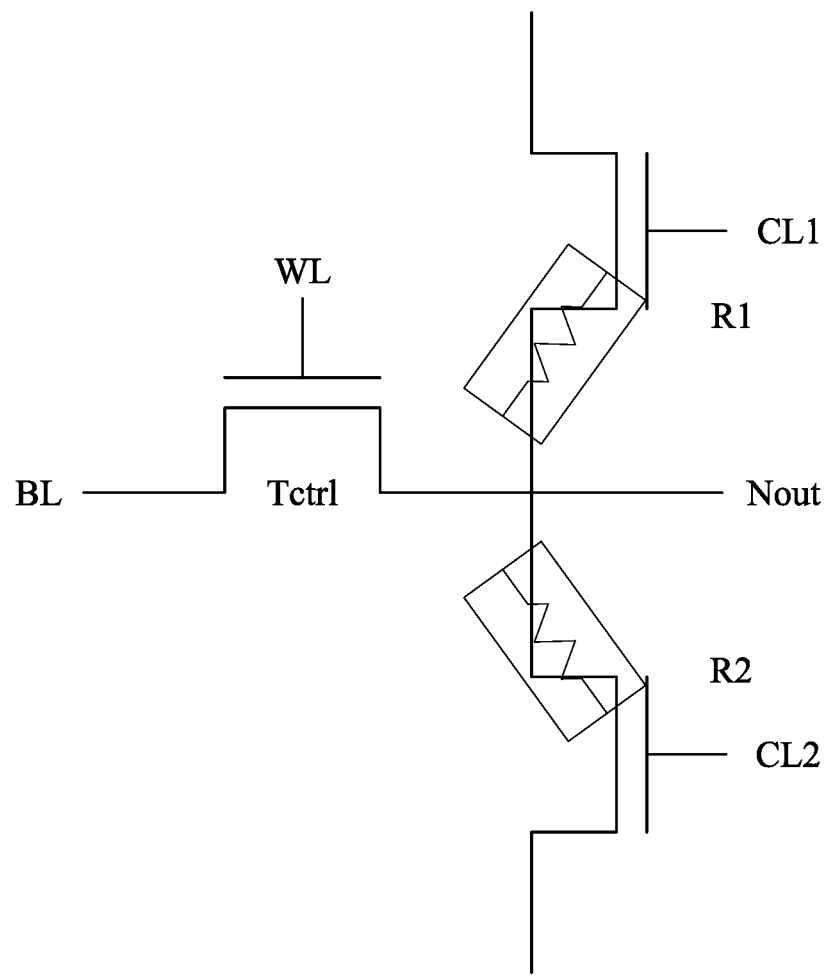
FIG. 2 is a schematic diagram of an example memory cell, in accordance with one embodiment.

FIG. 2 is a schematic diagram of an example memory cell 125A, in accordance with one embodiment. In some embodiments, the memory cell 125A includes a control transistor $T_{ctrl}$ and programmable resistors R1, R2. These components may operate together to store 2-bit data, where each of the programmable resistor R1, R2 may store a corresponding one bit data. In some embodiments, the control transistor T1 and the programmable resistors R1, R2 are embodied as components (e.g., source/drain structure (also referred to as "a doped region"), gate structure, etc.) for forming a transistor. In some embodiments, the memory cell 125A includes more, fewer, or different components than shown in FIG. 2. In some embodiments, the memory cell 125A includes one or more additional programmable resistors. In some embodiments, the memory cell 125A includes one programmable resistor, instead of two programmable resistors R1, R2.

In one configuration, the control transistor $T_{ctrl}$ includes a first source/drain structure coupled to a bit line BL, a gate structure coupled to a word line WL, and a second source/drain structure coupled to an output node $N_{out}$. In one configuration, the first programmable resistor R1 includes a source/drain structure coupled to the output node $N_{out}$, and a gate structure coupled to a first control line CL1. In one configuration, the second programmable resistor R2 includes a source/drain structure coupled to the output node $N_{out}$, and a gate structure coupled to a first control line CL2. In some embodiments, the source/drain structure of the programmable resistor R1 and the source/drain structure of the programmable resistor R2 may be implemented as a single component to achieve area efficiency. In some embodiments, the source/drain structure of the programmable resistor R1 and the source/drain structure of the programmable resistor R2 may be implemented as separate components. Each of the programmable resistors R1, R2 may lack a source/drain structure, or include a source/drain structure that is electrically floating. Hence, each of the programmable resistors R1, R2 may be modeled or represented as a transistor with a floating electrode.

In one aspect, each of the programmable resistors R1, R2 includes a dielectric layer having a configurable resistance. In one aspect, the dielectric layer is a conductive filament disposed between a gate structure and a source/drain structure for forming a transistor. The dielectric layer may include $TiN/HfO_2/SiO_2$ having a high electrical conductivity. By applying a voltage between the gate structure and the source/drain structure of the programmable resistor R, a resistance of the programmable resistor R may be set or changed. Examples of writing data to the programmable resistors R1, R2 and reading data from the programmable resistors R1, R2 are provided below with respect to FIGS. 4A-4C. By changing or setting a resistance of the dielectric layer, a programmable resistor R can be implemented with the same components such as the gate structure and the source/drain structure for forming a transistor.

Figure 3:
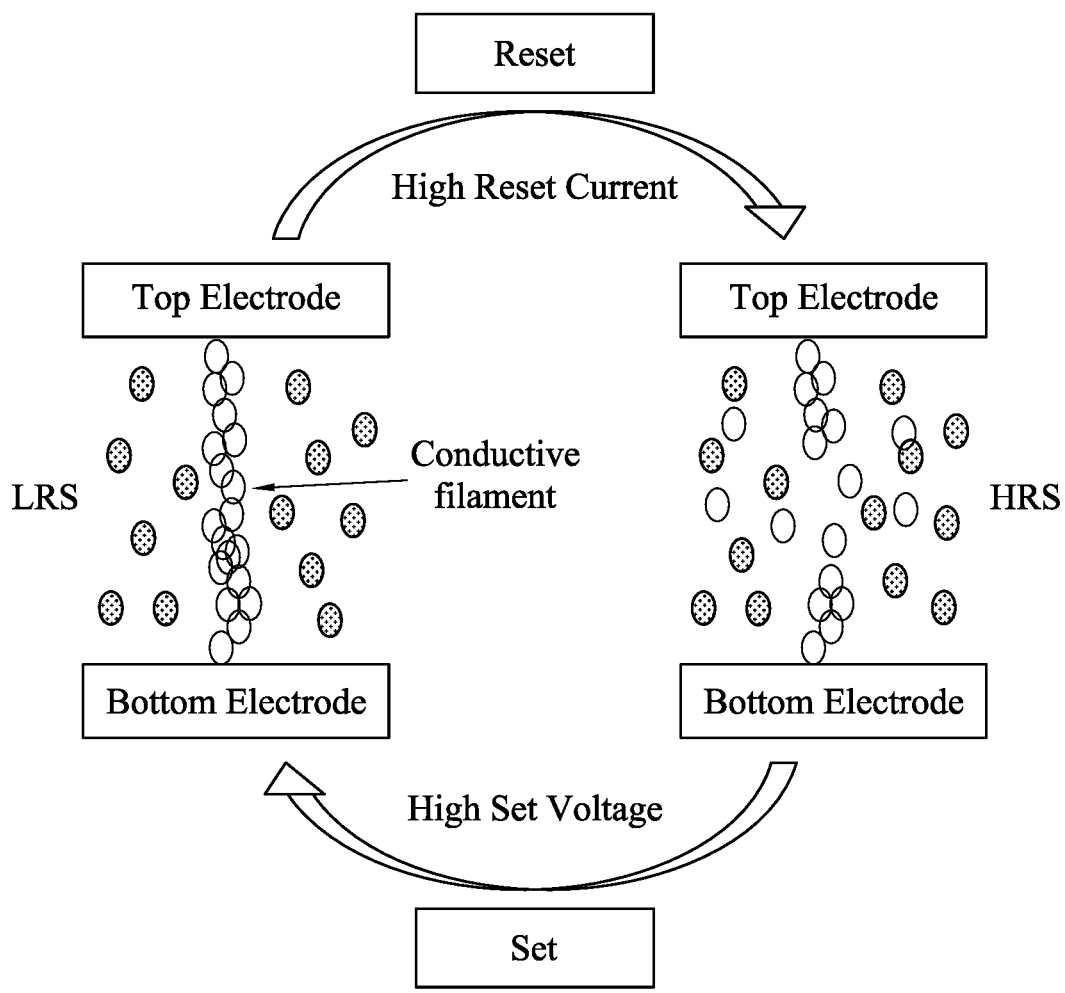
FIG. 3 is a diagram showing a programmable resistor having different resistances, in accordance with one embodiment.

FIG. 3 is a diagram showing a programmable resistor R having different resistances, in accordance with one embodiment. In one example, the programmable resistor R may have a low resistance state (LRS) by applying a high voltage across a gate structure and a source/drain structure. The high voltage across the gate structure and the source/drain structure may cause a large electric field, which may cause the programmable resistors R1, R2 to have a low resistance (e.g., less than 10 kΩ). The gate structure may correspond to a top electrode and the source/drain structure may correspond to a bottom electrode. In one example, the programmable resistor R may have a high resistance state (HRS) by applying a high current through the programmable resistor R. The current through the programmable resistor R may cause recombination of oxygen vacancies in the dielectric layer such that the programmable resistor R can have a high resistance (e.g., larger than 50 kΩ). By changing or configuring resistances of the programmable resistor R, the memory cell 125 may store one bit data.

Figure 4A:
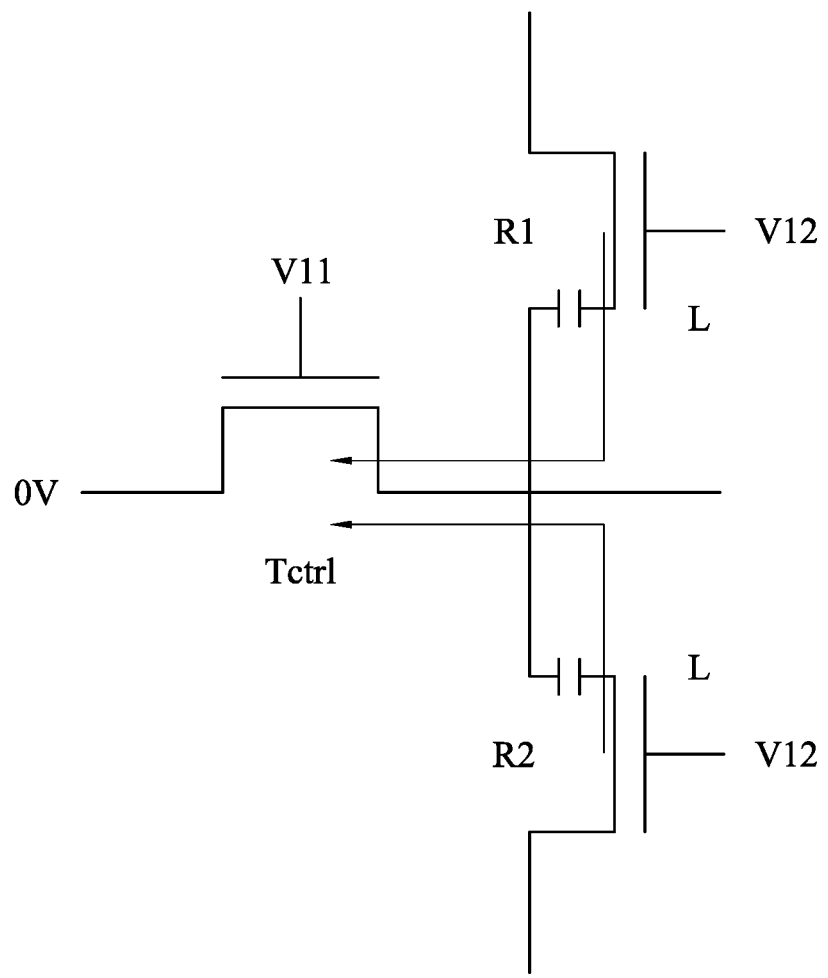
FIG. 4A is a diagram showing voltages applied to the memory cell of FIG. 2 to preset the memory cell, in accordance with one embodiment.

FIG. 4A is a diagram showing voltages applied to the memory cell 125A of FIG. 2 to preset the memory cell 125A during a preset time period, in accordance with one embodiment. The memory controller 105 may apply, during the preset time period, various voltages to the word line WL coupled to the gate structure of the transistor $T_{ctrl}$, the bit line BL coupled to the source structure of the control transistor $T_{ctrl}$, the control line CL1 coupled to the gate structure of the programmable resistor R1, and the control line CL2 coupled to the gate structure of the programmable resistor R2 to configure or set the programmable resistors R1, R2 to have the same resistances. In one aspect, during the preset time period, the memory controller 105 applies a voltage V11 (e.g., 0.4~1.2V) to the word line WL, a ground voltage (e.g., 0V) to the bit line BL, and a voltage V12 (e.g., 4~6V) to the control lines CL1, CL2. The voltage V11 may be larger than a threshold voltage of the control transistor $T_{ctrl}$ to enable the control transistor $T_{ctrl}$. When the control transistor $T_{ctrl}$ is enabled, the ground voltage (e.g., 0V) from the bit line BL can be applied to the output node $N_{out}$. By applying the voltage V12 (e.g., 4~6V) to gate structures of the programmable resistors R1, R2 while the ground voltage is applied to the output node $N_{out}$, a large electric field can be applied to the programmable resistors R1, R2, thereby causing the programmable resistors R1, R2 to have a low resistance (e.g., less than 10 kΩ).

Figure 4B:
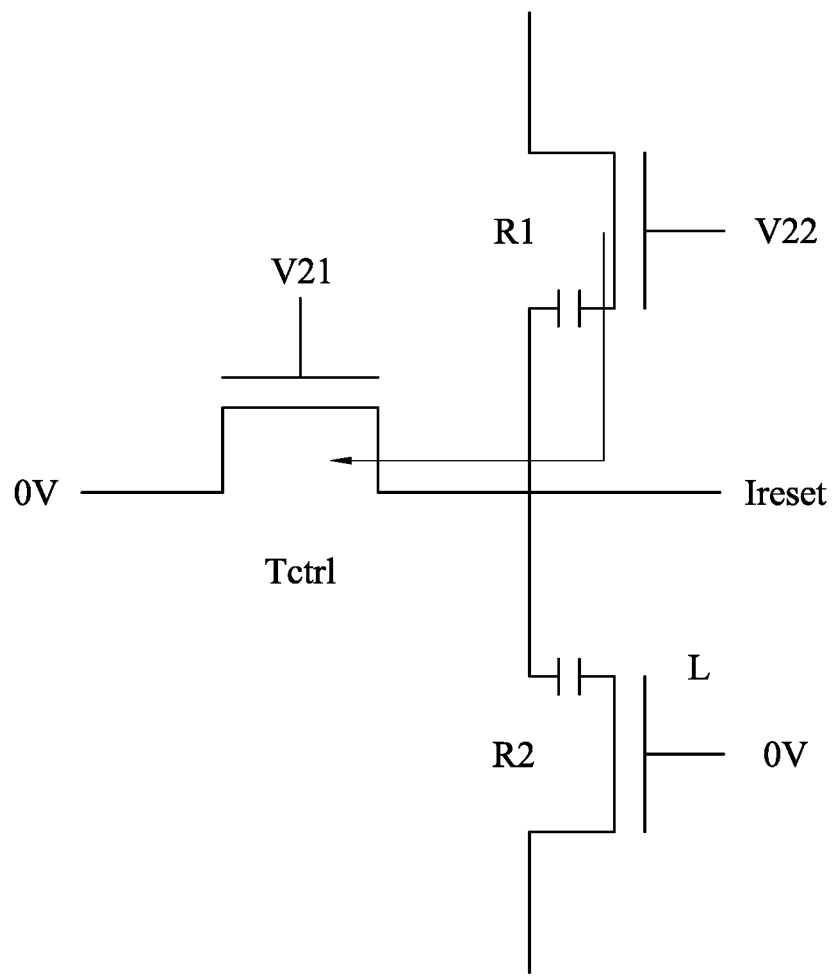
FIG. 4B is a diagram showing voltages applied to the memory cell of FIG. 2 to write data, in accordance with one embodiment.

FIG. 4B is a diagram showing voltages applied to the memory cell 125A of FIG. 2 to write a first state (e.g., logic '1') of data during a write time period, in accordance with one embodiment. The memory controller 105 may apply, during the write time period, various voltages to the word line WL, the bit line BL, the control line CL1, and the control line CL2 to configure or set the programmable resistors R1, R2 to have different resistances. In one aspect, to write the first state of data during the write time period, the memory controller 105 applies a voltage V21 (e.g., 0.4~1.2V) to the word line WL, a ground voltage (e.g., 0V) to the bit line BL, a voltage V22 (e.g., 2~2.5V) to the control line CL1, and the ground voltage (e.g., 0V) to the control line CL2. The voltage V21 applied to the word line WL may be larger than a threshold voltage of the control transistor $T_{ctrl}$ to enable the control transistor $T_{ctrl}$. The voltage V22 may be lower than the voltage V12 for presetting the programmable resistors R1, R2 applied during the preset time period. By applying the voltage V22 (e.g., 2~2.5V) to the gate structure of the programmable resistor R1 while the ground voltage is applied to the output node $N_{out}$, current can flow through the programmable resistor R1. The current through the programmable resistor R1 may cause recombination of oxygen vacancies in the dielectric layer such that the programmable resistor R1 can have a higher resistance (e.g., larger than 50 kΩ) than the low resistance set during the preset time period. Meanwhile, by applying the ground voltage (e.g., 0V) to the gate structure of the programmable resistor R2, current may not flow through the programmable resistor R2, such that the resistance of the programmable resistor R2 may remain unchanged.

To write a second state (e.g., logic '0') of data at the programmable resistor R1 during the write time period, the memory controller 105 may apply the ground voltage to the gate structure of the programmable resistor R1 instead of the voltage V22. By applying the ground voltage to the gate structure of the programmable resistor R1, the programmable resistor R1 may not conduct current, such that the resistance of the programmable resistor R1 may be maintained as the low resistance set during the preset time period.

The memory controller 105 may write data at the programmable resistor R2 through the similar process. For example, to write the first state (e.g., logic '1') of data at the programmable resistor R2 during the write time period, the memory controller 105 applies a voltage V21 (e.g., 0.4~1.2V) to the word line WL, a ground voltage (e.g., 0V) to the bit line BL, a voltage V22 (e.g., 2~2.5V) to the control line CL2, and the ground voltage (e.g., 0V) to the control line CL1. To write the second state (e.g., logic '0') of data at the programmable resistor R2 during the write time period, the memory controller 105 applies the ground voltage to the gate structure of the programmable resistor R2 instead of the voltage V22.

Figure 4C:
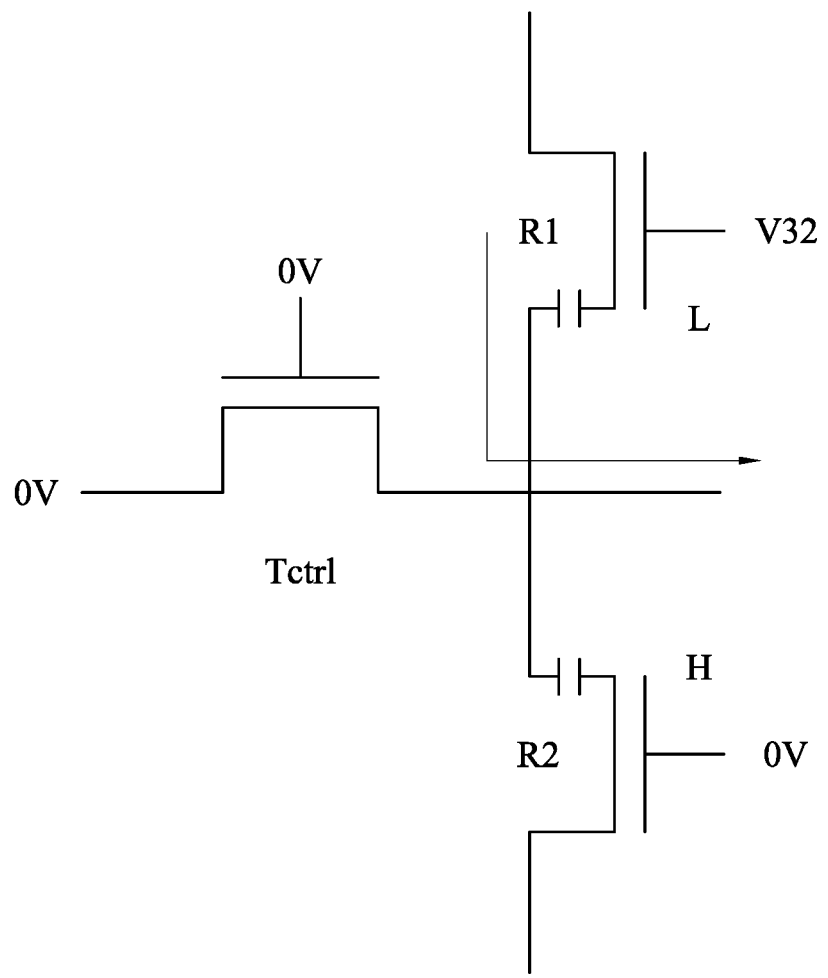
FIG. 4C is a diagram showing voltages applied to the memory cell of FIG. 2 to read data stored by the memory cell, in accordance with one embodiment.

FIG. 4C is a diagram showing voltages applied to the memory cell 125A of FIG. 2 to read data stored by the programmable resistor R1 during a read time period, in accordance with one embodiment. The memory controller 105 may apply, during the read time period, various voltages to the word line WL, the bit line BL, and the control lines CL1, CL2 to sense current through the programmable resistors R1, R2 to determine data stored by the programmable resistors R1, R2.

In one aspect, the memory controller 105 may apply, to read data stored by the programmable resistor R1 during the read time period, a voltage V32 (e.g., 1~2V) to the control line CL1, and the ground voltage (e.g., 0V) to the control line CL2, while the control transistor $T_{ctrl}$ is disabled. In one aspect, the memory controller 105 may apply, during the read time period, a ground voltage (e.g., 0V) to the word line WL, and the ground voltage (e.g., 0V) to the bit line BL to disable the control transistor $T_{ctrl}$. When the control transistor $T_{ctrl}$ is disabled, the output node $N_{out}$ can be electrically decoupled from the bit line BL. By applying the voltage V32 to the control line CL1 while applying the ground voltage to the control line CL2, the programmable resistor R1 may conduct current according to the resistance of the programmable resistor R1 while the programmable resistor R2 may not conduct current. For example, if the programmable resistor R1 has a high resistance (e.g., larger than 50Ω), then the current through the output node $N_{out}$ may be lower than the predetermined threshold. For example, if the programmable resistor R1 has a low resistance (e.g., less than 10 kΩ), then the current through the output node $N_{out}$ may be larger than the predetermined threshold. The memory controller 105 may sense the current through the $N_{out}$ in response to the voltage V32 (e.g., 1~2V) applied to the control line CL1 and determine a value of one bit data stored by the programmable resistor R1 according to the sensed current.

The memory controller 105 may read data stored by the programmable resistor R2 through the similar process. For example, the memory controller 105 may apply, during the read time period, the voltage V32 (e.g., 1~2V) to the control line CL2, and the ground voltage (e.g., 0V) to the control line CL1, while the control transistor $T_{ctrl}$ is disabled. The memory controller 105 may sense the current through the $N_{out}$ in response to the voltage V32 (e.g., 1~2V) applied to the control line CL2 and determine a value of one bit data stored by the programmable resistor R2 according to the sensed current.

Figure 5A:
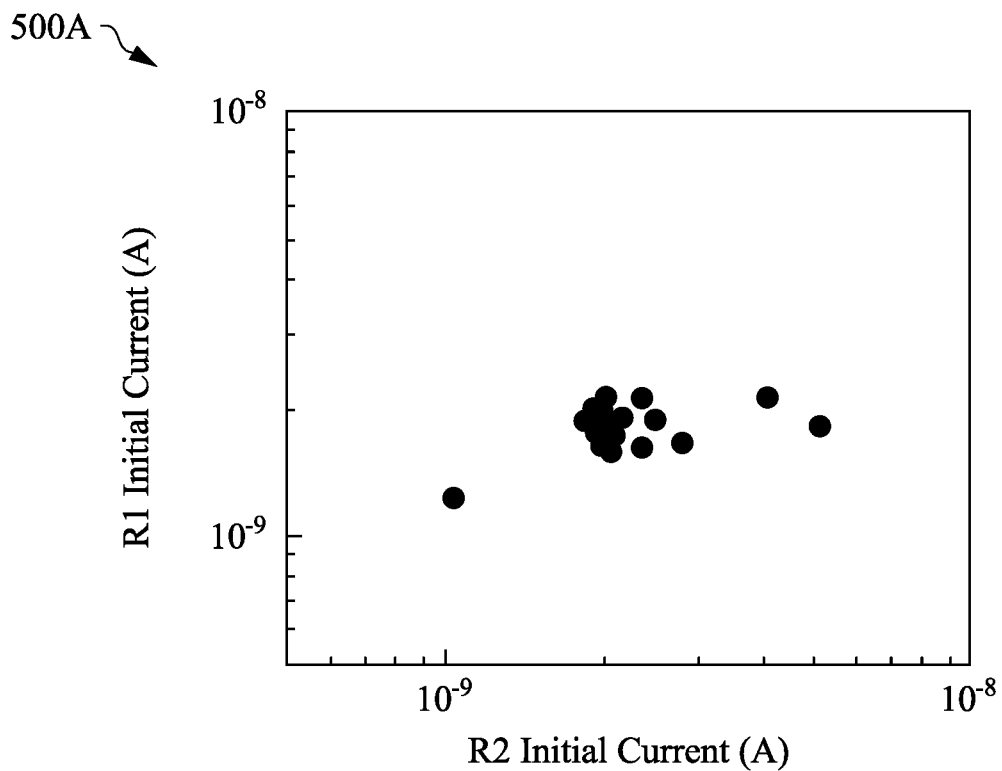
FIGS. 5A-5D show current through programmable resistors, in accordance with one embodiment.
Figure 5B:
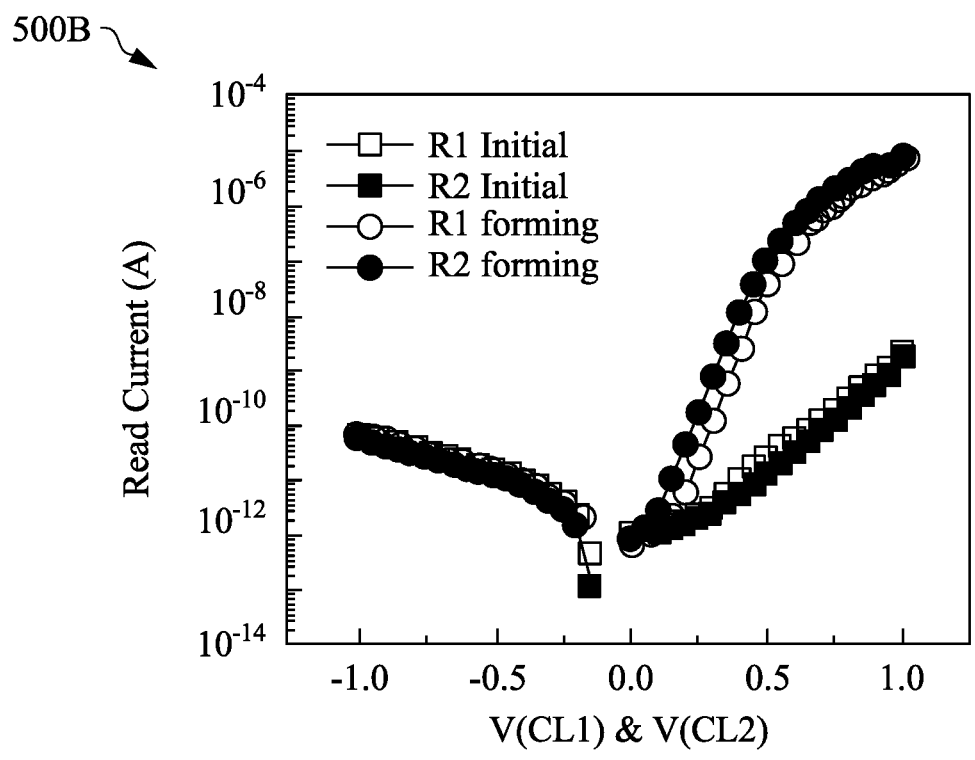
Figure 5C:
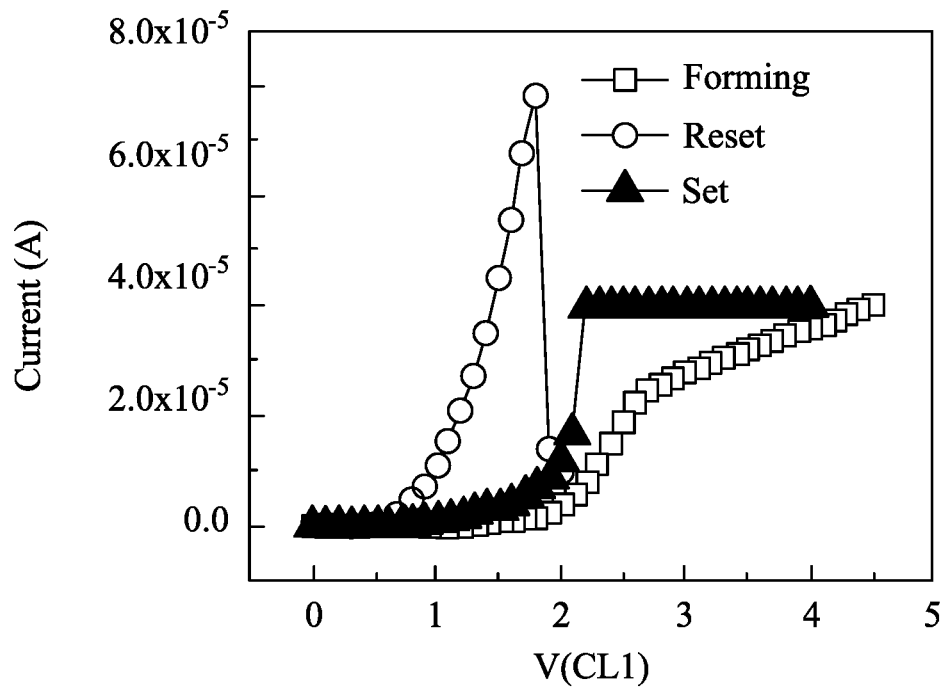
Figure 5D:
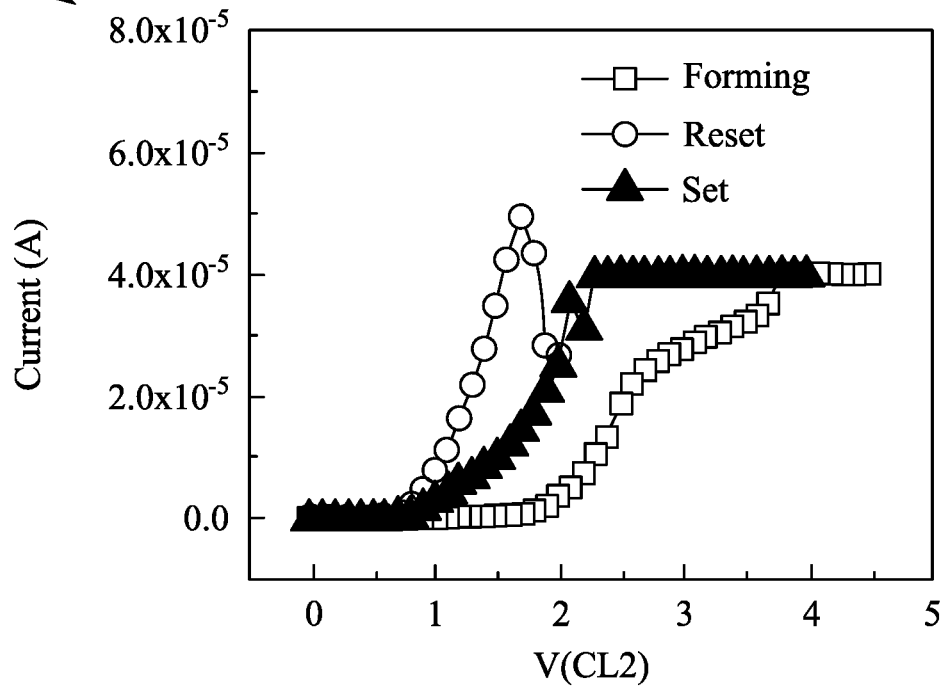

FIGS. 5A-5D show current through programmable resistors, in accordance with one embodiment. Plot 500A in FIG. 5A shows initial current through the programmable resistors R1, R2 on 20 dies before presetting the resistances of the programmable resistors R1, R2. Plot 500B in FIG. 5B shows current through the programmable resistors R1, R2 before presetting the programmable resistors R1, R2, and after presetting the programmable resistors R1, R2, in response to varying voltages applied to the control lines CL1, CL2. As shown in the plots 500A, 500B, the programmable resistors R1, R2 display symmetrical characteristics, thus the programmable resistors R1, R2 can be preset to have the same or similar resistances. Plot 500C in FIG. 5C shows current through the programmable resistor R1, in response to a varying voltage applied to the control line CL1. Plot 500D in FIG. 5D shows current through the programmable resistors R2, in response to a varying voltage applied to the control line CL2. As shown in the plots 500C, 500D, the resistances of the programmable resistors R1, R2 can be set independently, such that each programmable resistor may store a corresponding one bit data.

Figure 6A:
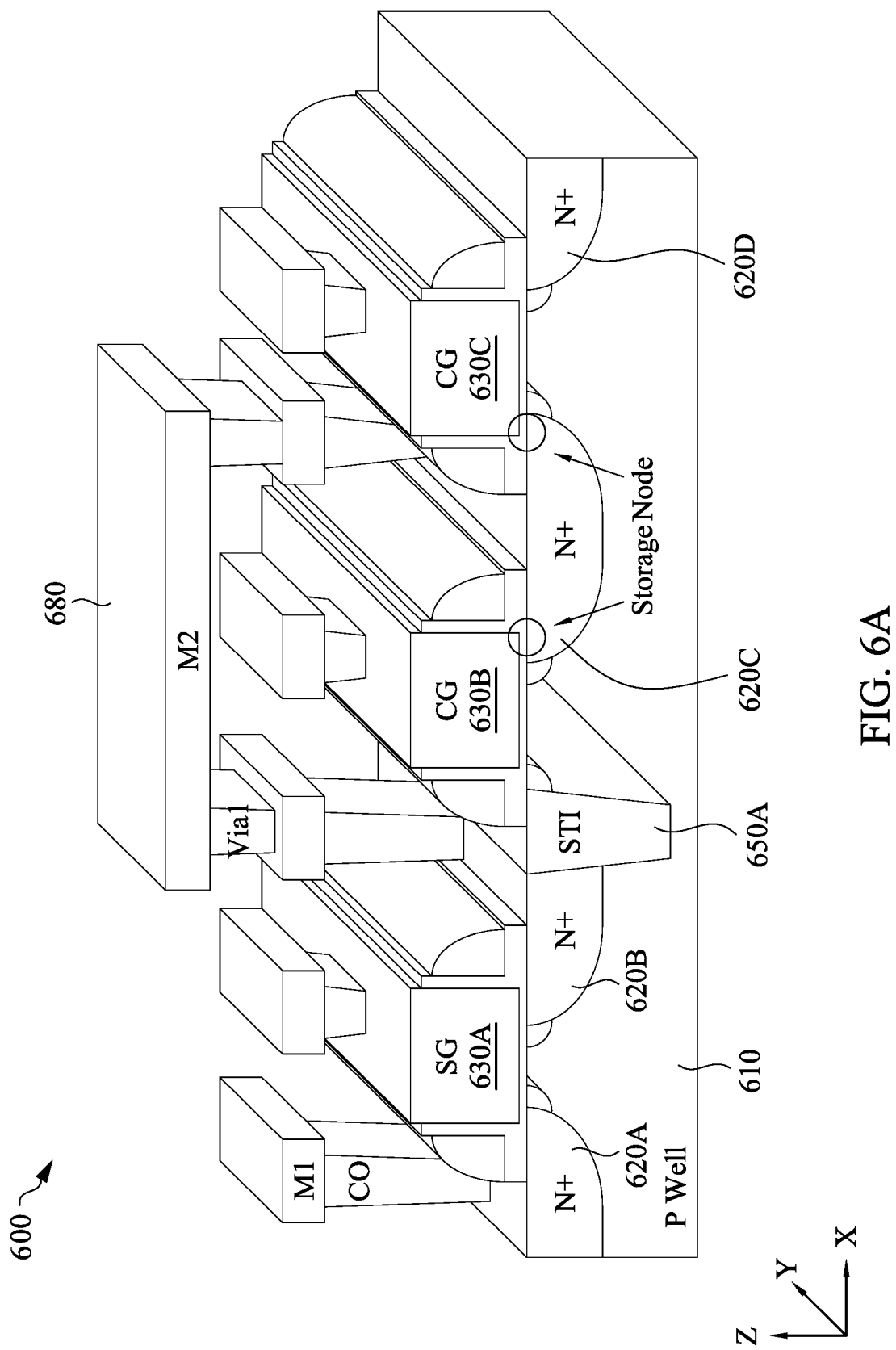
FIG. 6A is a diagram showing a configuration of a memory cell of FIG. 2, in accordance with one embodiment.
Figure 6B:
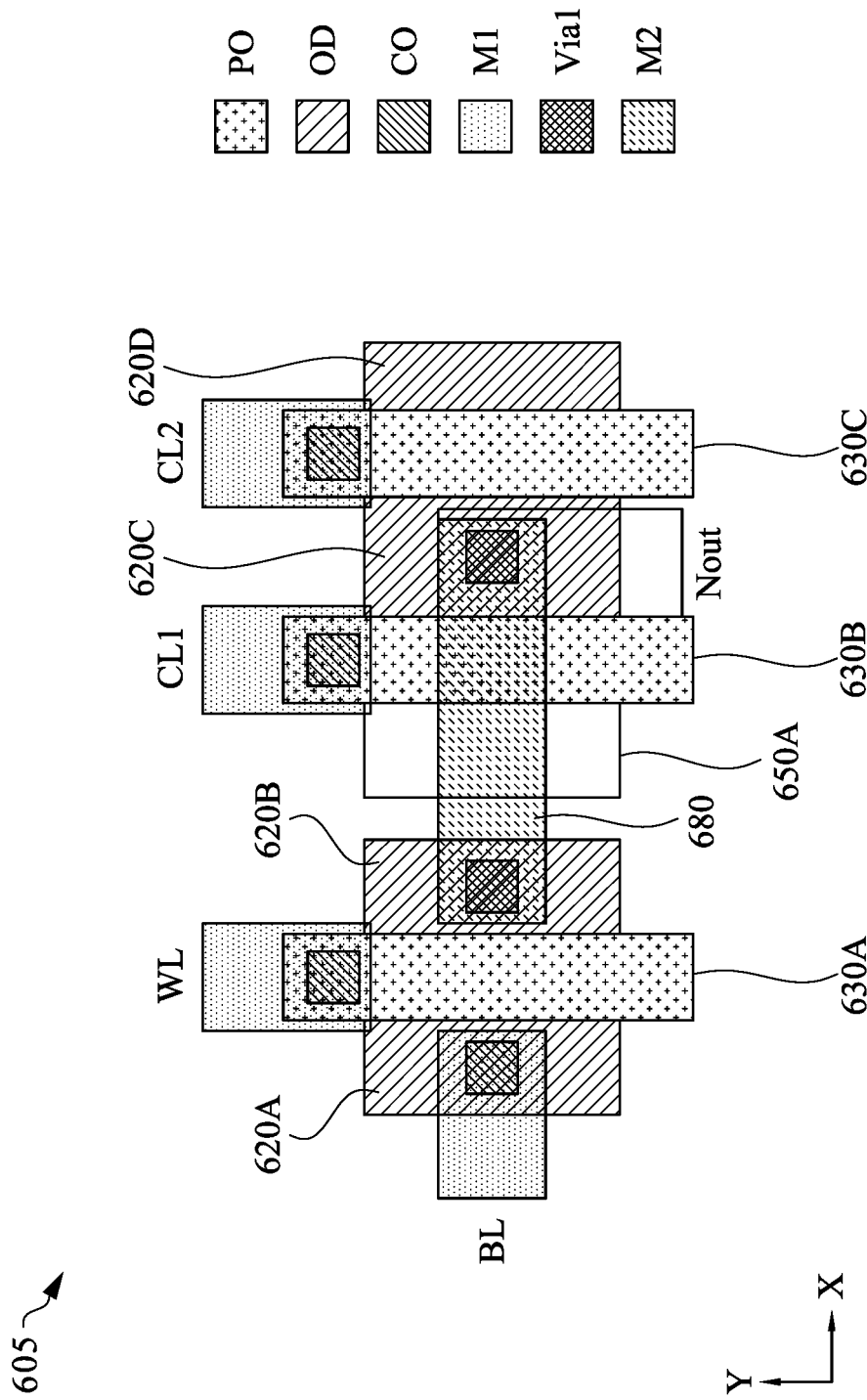
FIG. 6B is a diagram showing a top-plan view of a memory cell of FIG. 2, in accordance with one embodiment.

FIG. 6A is a diagram showing a configuration 600 of the memory cell 125A of FIG. 2, in accordance with one embodiment. FIG. 6B is a diagram showing a top-plan view 605 of a memory cell of FIG. 2, in accordance with one embodiment. In some embodiments, the memory cell 125A includes the control transistor $T_{ctrl}$ and programmable resistors R1, R2 implemented with components for forming N-type transistors (e.g., N-type MOSFETs). In some embodiments, the memory cell 125A includes a substrate including a P-well 610. Within the P-well 610, the memory cell 125A includes source/drain structures 620A, 620B, 620C, 620D for forming transistors. The source/drain structures 620A, 620B, 620C, 620D may include N-type doping materials. Above the substrate, the memory cell 125A includes gate structures 630A, 630B, 630C. The gate structures 630A, 630B, 630C may include polysilicon or any conductive materials. The gate structure 630A may be electrically coupled to the word line WL, the gate structure 630B may be electrically coupled to the control line CL1, and the gate structure 630C may be electrically coupled to the control line CL2. The source/drain structure 620A may be electrically coupled to the bit line BL through a metal rail (e.g., M1).

In one aspect, the source/drain structures 620A, 620B and the gate structure 630A constitute the control transistor $T_{ctrl}$. In one aspect, the shared source/drain structure 620C and the gate structure 630B constitute the programmable resistor R1. In one aspect, the shared source/drain structure 620C and the gate structure 630C constitute the programmable resistor R2. In one aspect, the programmable resistors R1, R2 may share the source/drain structure 620C to reduce area. The programmable resistor R1 may include a dielectric layer between the gate structure 630B and the shared source/drain structure 620C. The programmable resistor R2 may include a dielectric layer between the gate structure 630C and the shared source/drain structure 620C. Resistances of the dielectric layer may be adjusted or set according to voltages or current applied as described above with respect to FIGS. 2 through 4. In one aspect, the source/drain structure 620D is electrically isolated from other components, such that the programmable resistor R2 may have a floating source/drain structure. The source/drain structure 620B may be electrically coupled to the shared source/drain structure 620C through an interconnect metal rail 680 (e.g., M2). The interconnect metal rail 680 may be disposed above the gate structure 630B to electrically couple between the source/drain structure 620B and the shared source/drain structure 620C. The interconnect metal rail 680 may correspond to the output node $N_{out}$, through which the current through the programmable resistors R1, R2 can be sensed.

In one aspect, the memory cell 125A includes an insulating structure 650A instead of another source/drain structure for forming a transistor. The insulating structure 650A may be formed through shallow trench isolation (STI). By implementing the insulating structure 650A instead of a source/drain structure, the programmable resistor R1 can be modeled or represented as a transistor including a floating source/drain structure. The insulating structure 650A may be disposed between the gate structure 630B and the source/drain structure 620B to electrically isolate between the gate structure 630B and the source/drain structure 620B. A first portion of the dielectric layer of the programmable resistor R1 may contact a portion of the shared source/drain structure 620C, where a second portion of the dielectric layer of the programmable resistor R1 may contact a portion of the insulating structure 650A. By implementing the insulating structure 650A to replace a source/drain structure, the switch transistor $T_{ctrl}$ and the programmable resistors R1 can be implemented closely with each other to reduce the area of the memory cell 125A.

Figure 7A:
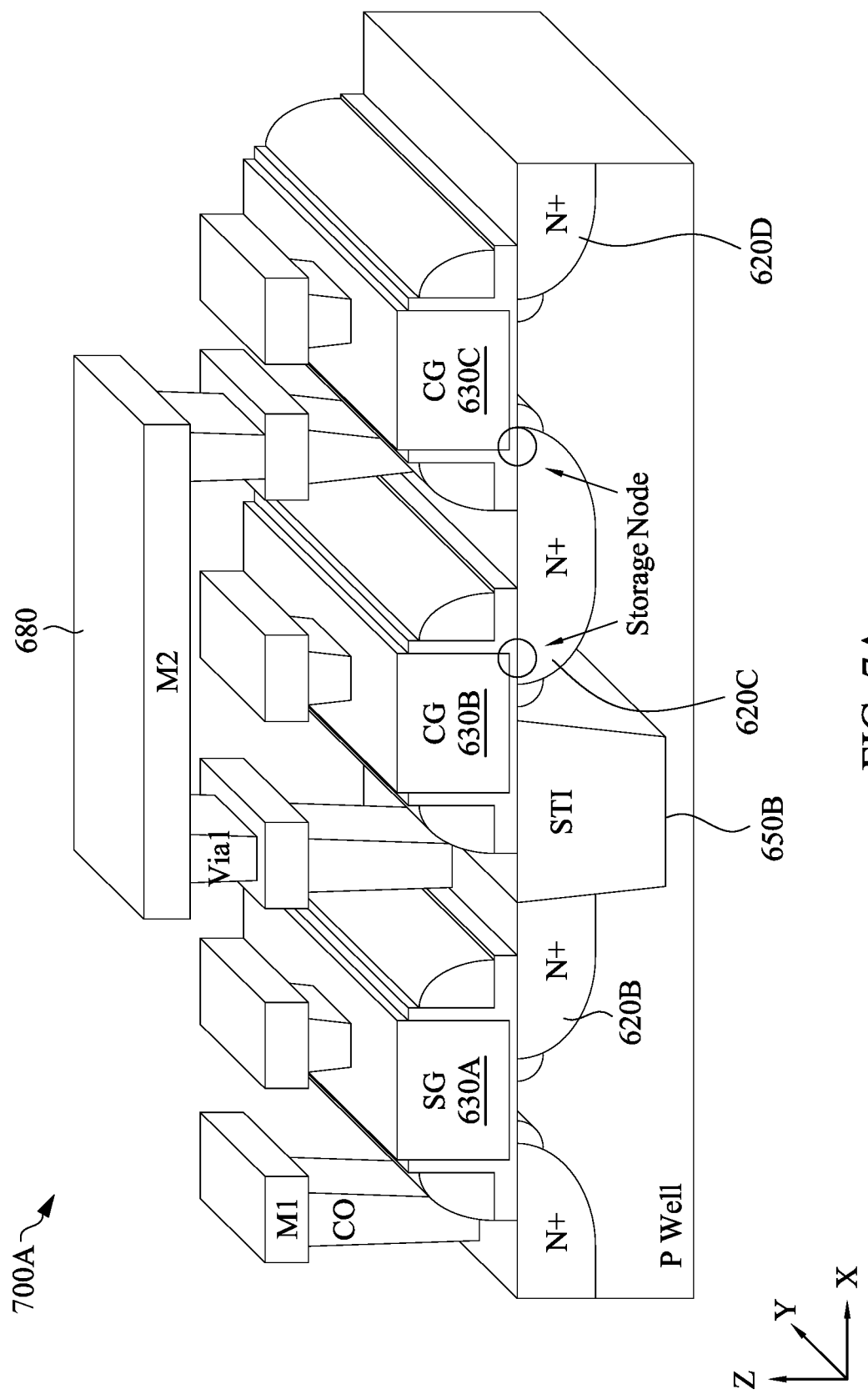
FIG. 7A is a diagram showing a configuration of a memory cell of FIG. 2, in accordance with one embodiment.

FIG. 7A is a diagram showing a configuration 700A of a memory cell of FIG. 2, in accordance with one embodiment. The configuration 700A of the memory cell 125A in FIG. 7A is similar to the configuration 600 of the memory cell 125A shown in FIG. 6A, except the memory cell 125A in the configuration 700A includes a larger insulating structure 650B than the insulating structure 650A. In one aspect, the insulating structure 650B can extend towards the shared source/drain structure 620C to partially overlap with the gate structure 630B. Advantageously, the larger insulating structure 650B can provide a better isolation between the gate structure 630B and the source/drain structure 620B of the switch transistor $T_{ctrl}$.

Figure 7B:
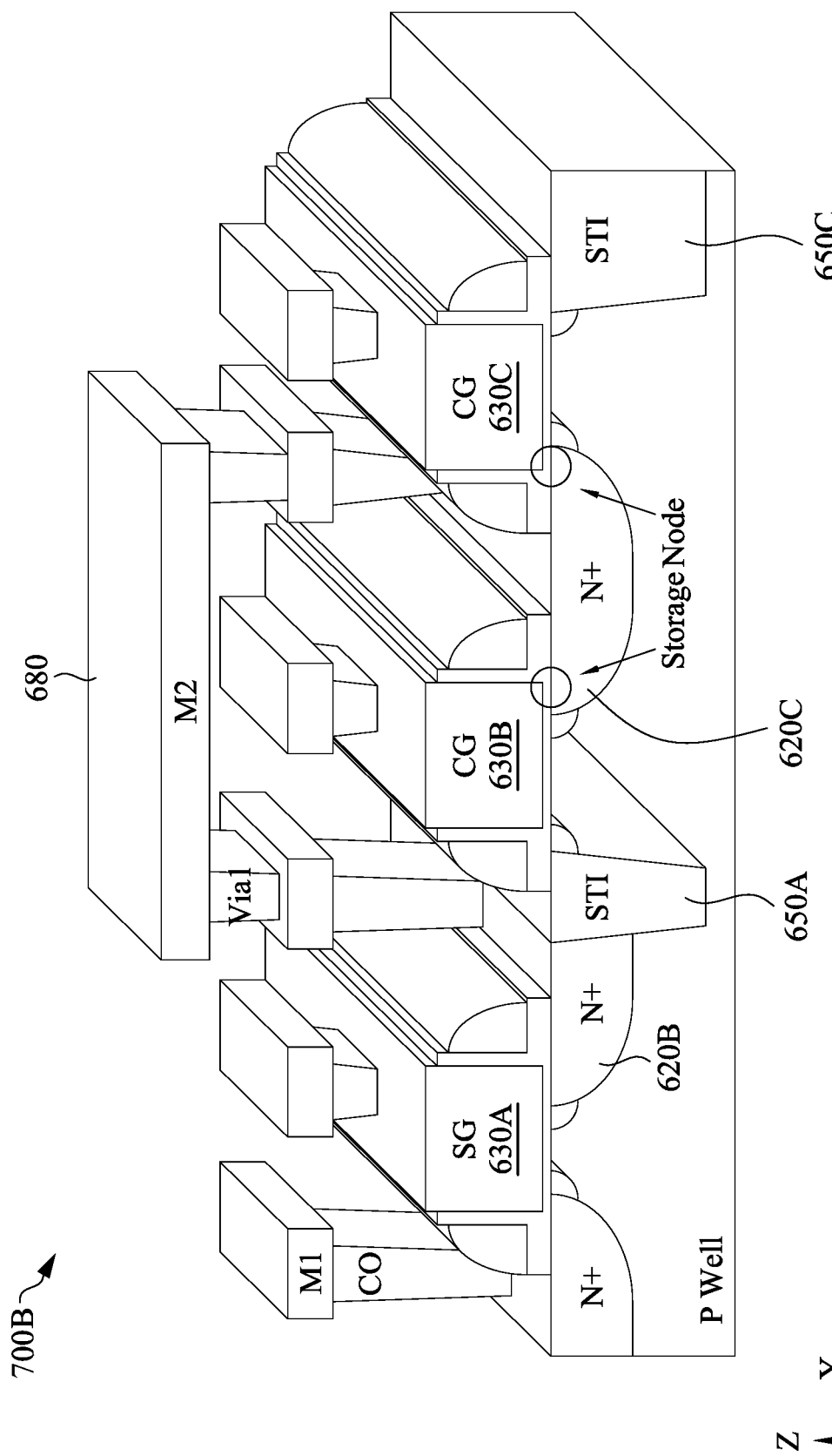
FIG. 7B is a diagram showing a configuration of a memory cell of FIG. 2, in accordance with one embodiment.

FIG. 7B is a diagram showing a configuration 700B of the memory cell 125A of FIG. 2, in accordance with one embodiment. The configuration 700B of the memory cell 125A in FIG. 7B is similar to the configuration 600 shown in FIG. 6A, except the memory cell 125A in the configuration 700B includes another insulating structure 650C instead of the source/drain structure 620D. By implementing the insulating structure 650C, the programmable resistor R2 can be modeled or represented as a transistor including a floating source/drain structure. Advantageously, by implementing the insulating structure 650C to replace the source/drain structure 620D, the programmable resistors R1, R2 may have a symmetrical configuration, such that the programmable resistors R1, R2 may have similar characteristics.

Figure 7C:
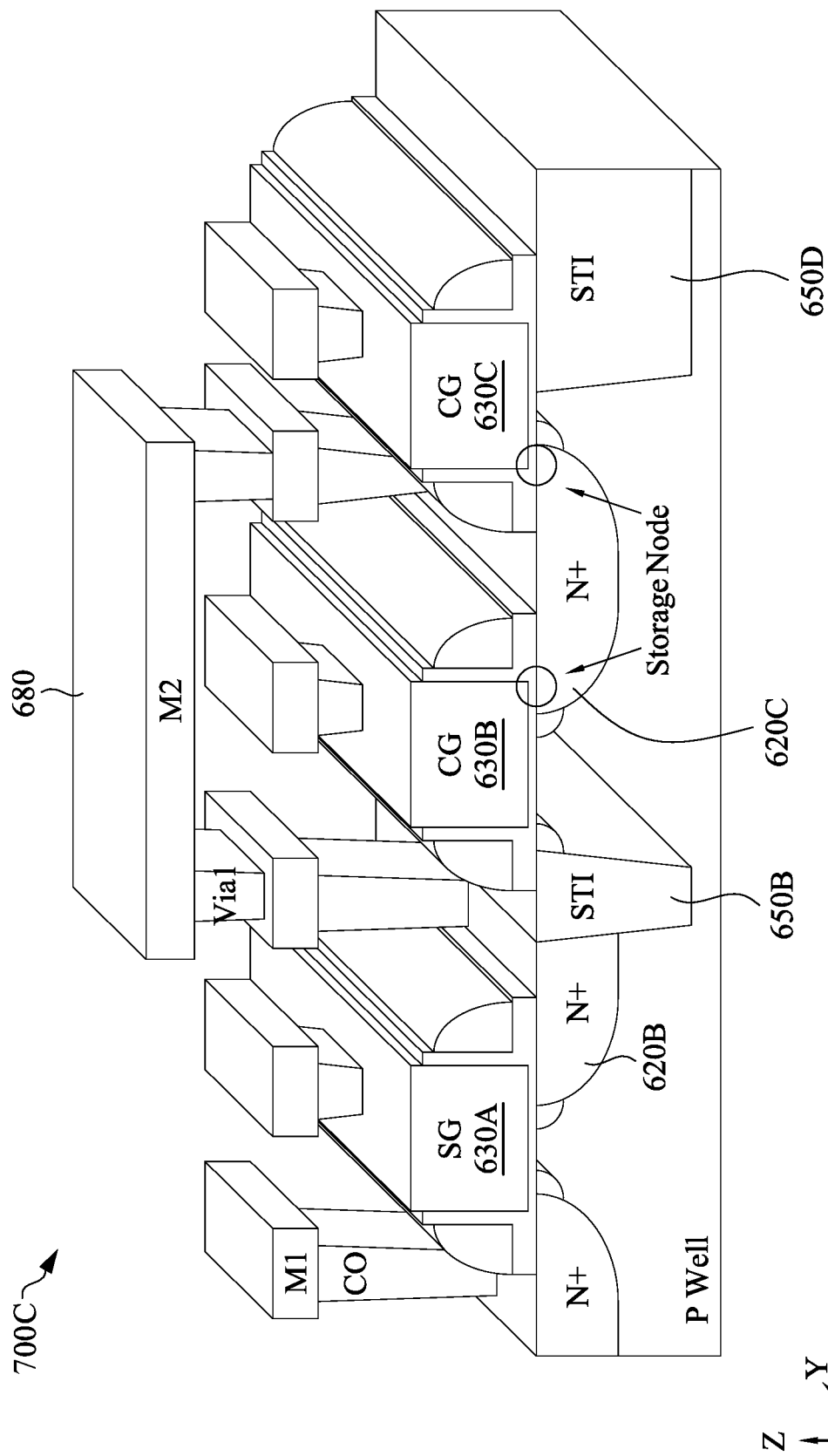
FIG. 7C is a diagram showing a configuration of a memory cell of FIG. 2, in accordance with one embodiment.

FIG. 7C is a diagram showing a configuration 700C of the memory cell 125A of FIG. 2, in accordance with one embodiment. The configuration 700C of the memory cell 125A in FIG. 7C is similar to the configuration 700B shown in FIG. 7B, except the memory cell 125A in the configuration 700C includes a larger insulating structure 650D instead of the insulating structure 650C. In one aspect, the insulating structure 650D can extend towards the shared source/drain structure 620C to partially overlap with the gate structure 630C. Advantageously, the larger insulating structure 650D can provide a better isolation between the gate structure 630C and other components (e.g., other programmable resistors or transistors in different memory cells).

Figure 8:
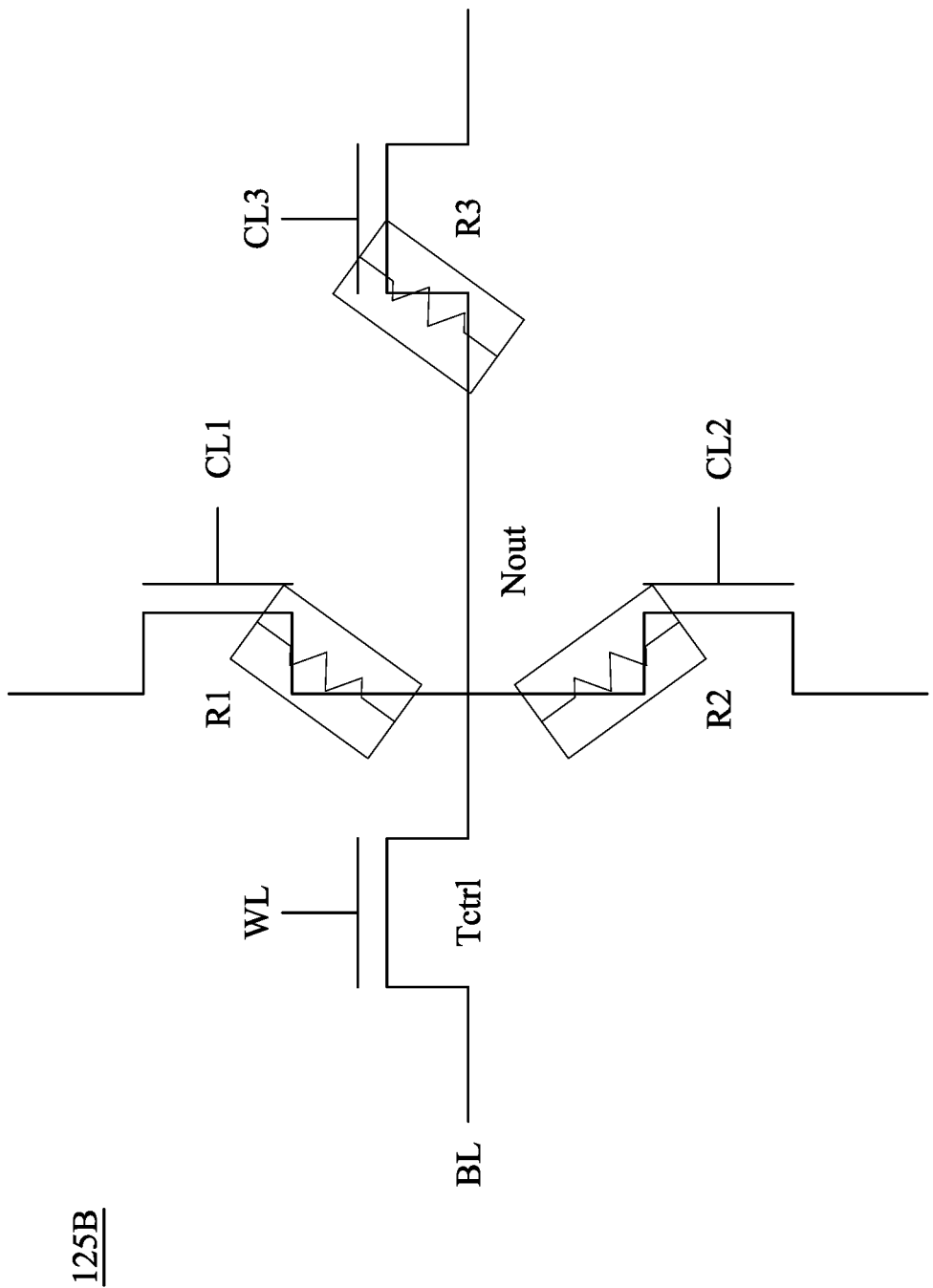
FIG. 8 is a schematic diagram of an example memory cell including three programmable resistors, in accordance with one embodiment.

FIG. 8 is a schematic diagram of an example memory cell 125B including three programmable resistors R1, R2, R3, in accordance with one embodiment. The memory cell 125B is similar to the memory cell 125A of FIG. 2, except the memory cell 125B includes an additional programmable resistor R3 coupled to the output node $N_{out}$. By implementing the additional programmable resistor R3, the memory cell 125B can store an additional bit of data. Thus, detailed description of the duplicated portion thereof is omitted herein for the sake of brevity.

Figure 9B:
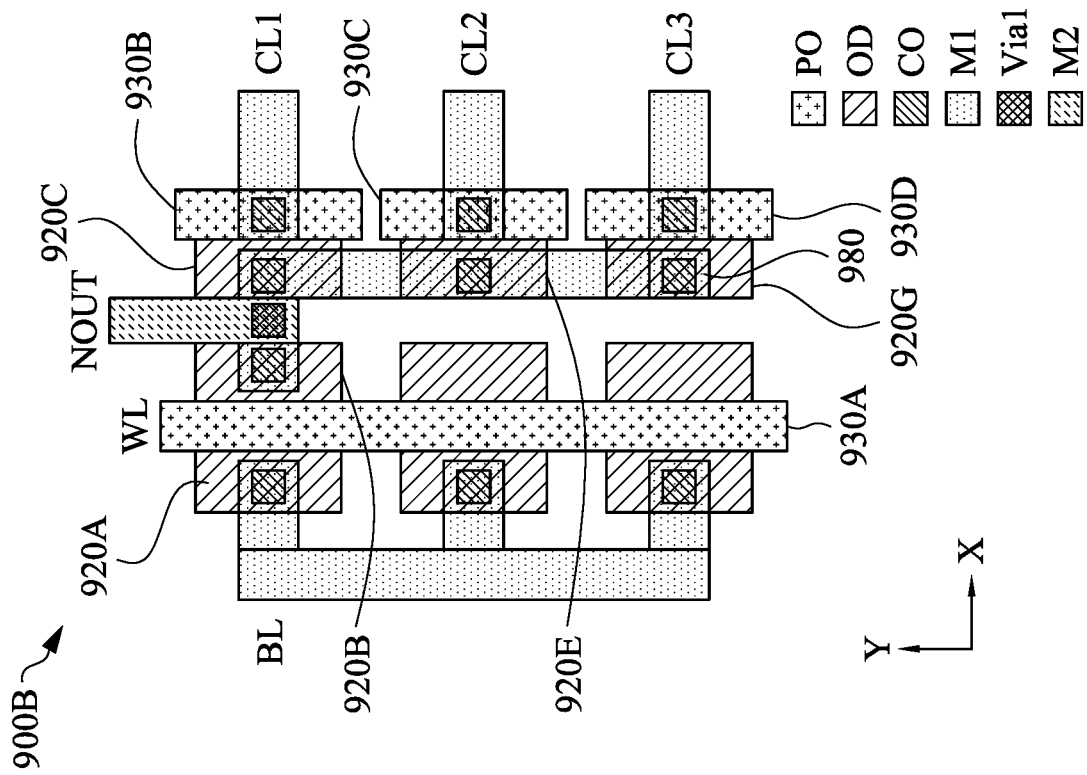
FIG. 9B is a diagram showing a top-plan view of a memory cell of FIG. 8, in accordance with one embodiment.
Figure 9A:
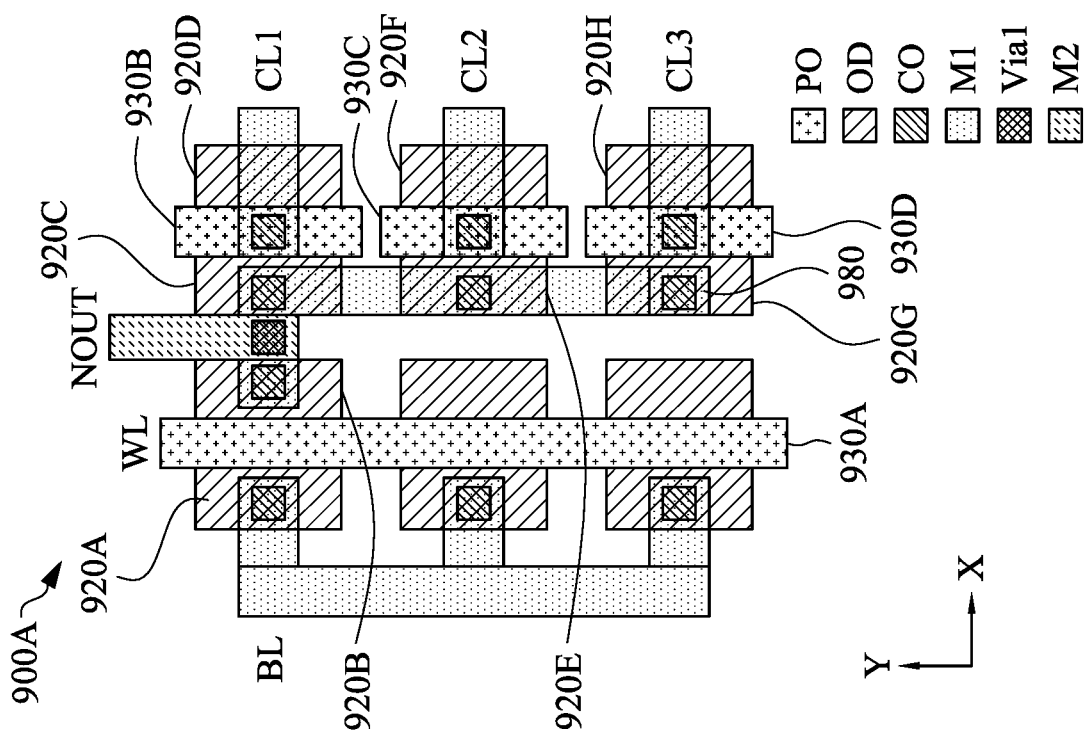
FIG. 9A is a diagram showing a top-plan view of a memory cell of FIG. 8, in accordance with one embodiment.

FIG. 9A is a diagram showing a top-plan view 900A of the memory cell 125B of FIG. 8, in accordance with one embodiment. In some embodiments, the memory cell 125B includes source/drain structures 920A-920H, gate structures 930A-930D, and an interconnect metal rail 980. In one aspect, the source/drain structure 920A, 920B and the gate structure 930A constitute the control transistor $T_{ctrl}$. In one aspect, the source/drain structure 920C, 920D and the gate structure 930B constitute the programmable resistor R1. In one aspect, the source/drain structure 920E, 920F and the gate structure 930C constitute the programmable resistor R2. In one aspect, the source/drain structure 920G, 920H and the gate structure 930D constitute the programmable resistor R3. The source/drain structures 920D, 920F, 920H may be electrically floated, such that no voltage or current is provided. In one aspect, the control transistor $T_{ctrl}$ and the programmable resistor R1 are disposed along a first direction (e.g., X-direction), and the programmable resistors R1, R2, R3 are disposed along a second direction (e.g., Y-direction). In one aspect, the interconnect metal rail 980 is electrically coupled to the source/drain structures 920B, 920C, 920E, 920G through via contacts. In this configuration, the interconnect metal rail 980 may correspond to the output node $N_{out}$. By placing the control transistor $T_{ctrl}$ and the programmable resistor R1 along the first direction (e.g., X-direction) and placing the programmable resistors R1, R2, R3 along the second direction (e.g., Y-direction), and electrically connecting the source/drain structures 920B, 920C, 920E, 920G through the interconnect metal rail 980, the memory cell 125B including three programmable resistors R1, R2, R3 can be implemented in a compact form through a simple fabrication process for forming transistors.

FIG. 9B is a diagram showing a top-plan view 900B of the memory cell 125B of FIG. 8, in accordance with one embodiment. The top-plan view 900B of the memory cell 125B shown in FIG. 9B may be similar to the top-plan view 900A of the memory cell 125A shown in FIG. 9A, except the source/drain structures 920D, 920F, 920H are omitted. The source/drain structures 920D, 920F, 920H can be replaced by insulating structures, such that the programmable resistors R1, R2, R3 can be represented as transistors including floating source/drain structures. The insulating structures may provide a better isolation among the programmable resistors R1, R2, R3, or among other components (e.g., other programmable resistors or transistors in different memory cells).

Figure 10:
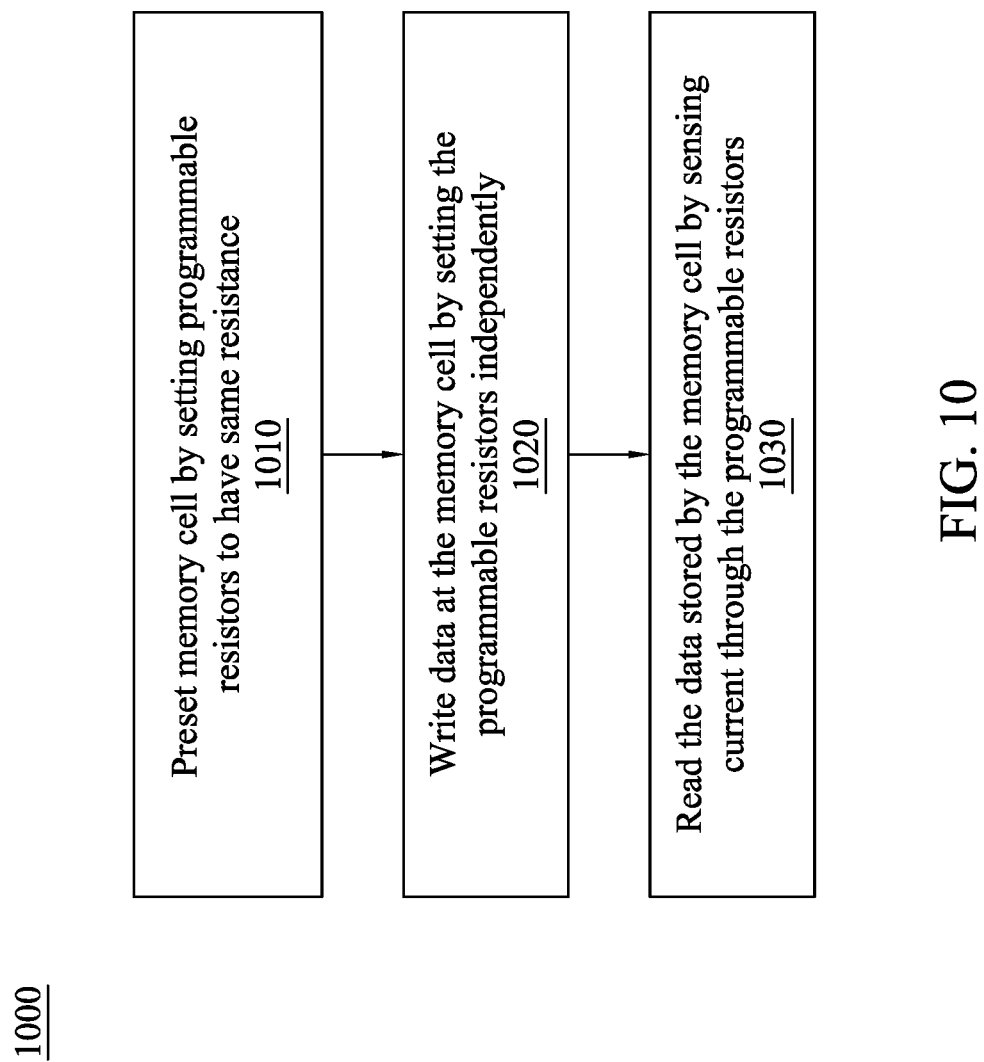
FIG. 10 is a flowchart showing a method of writing data at a memory cell and reading data stored by the memory cell, in accordance with some embodiments.

FIG. 10 is a flowchart showing a method 1000 of writing data at a memory cell and reading data stored by a memory cell (e.g., memory cell 125), in accordance with some embodiments. The method 1000 may be performed by the memory controller 105 of FIG. 1. In some embodiments, the method 1000 is performed by other entities. In some embodiments, the method 1000 includes more, fewer, or different operations than shown in FIG. 10.

In an operation 1010, the memory controller 105 may preset, during the preset time period, the programmable resistors R1, R2 to have the same resistances. In one approach, during the preset time period, the memory controller 105 applies a voltage V11 (e.g., 0.4~1.2V) to the word line WL, a ground voltage (e.g., 0V) to the bit line BL, and a voltage V12 (e.g., 4~6V) to the control lines CL1, CL2. The voltage V11 may be larger than a threshold voltage of the control transistor $T_{ctrl}$ to enable the control transistor $T_{ctrl}$. When the control transistor $T_{ctrl}$ is enabled, the ground voltage (e.g., 0V) from the bit line BL can be applied to the output node $N_{out}$. By applying the voltage V12 (e.g., 4~6V) to gate structures of the programmable resistors R1, R2 while the ground voltage is applied to the output node $N_{out}$, a large electric field can be applied to the programmable resistors R1, R2, thereby causing the programmable resistors R1, R2 to have a low resistance (e.g., less than 10 kΩ).

In an operation 1020, the memory controller 105 may write data at the memory cell 125 during the write time period. In one approach, the memory controller 105 may write a first bit of data at the programmable resistor R1 during a first portion of the write time period and write a second bit of data at the programmable resistor R2 during a second portion of the write time period.

To write a first state (e.g., logic value '1') at the programmable resistor R1, the memory controller 105 applies, during the write time period, a voltage V21 (e.g., 0.4~1.2V) to the word line WL, a ground voltage (e.g., 0V) to the bit line BL, a voltage V22 (e.g., 2~2.5V) to the control line CL1, and the ground voltage (e.g., 0V) to the control line CL2. The voltage V21 applied to the word line WL may be larger than a threshold voltage of the control transistor $T_{ctrl}$ to enable the control transistor $T_{ctrl}$. The voltage V22 may be lower than the voltage V12 for presetting the programmable resistors R1, R2 applied during the preset time period. By applying the voltage V22 (e.g., 2~2.5V) to the gate structure of the programmable resistor R1 while the ground voltage is applied to the output node $N_{out}$, current can flow through the programmable resistor R1. The current through the programmable resistor R1 may cause recombination of oxygen vacancies in the dielectric layer such that the programmable resistor R1 can have a higher resistance (e.g., larger than 50 kΩ) than the low resistance set during the preset time period. Meanwhile, by applying the ground voltage (e.g., 0V) to the gate structure of the programmable resistor R2, current may not flow through the programmable resistor R2, such that the resistance of the programmable resistor R2 may remain unchanged.

To write a second state (e.g., logic '0') at the programmable resistor R1, the memory controller 105 may apply, during the write time period, the ground voltage to the gate structure of the programmable resistor R1. By applying the ground voltage to the gate structure of the programmable resistor R1, the programmable resistor R1 may not conduct current, such that the resistance of the programmable resistor R1 may be maintained as the resistance (e.g., low resistance) set during the preset time period.

The memory controller 105 may write data at the programmable resistor R2 through the similar process. For example, to write the first state (e.g., logic '1') of data at the programmable resistor R2 during the write time period, the memory controller 105 applies a voltage V21 (e.g., 0.4~1.2V) to the word line WL, a ground voltage (e.g., 0V) to the bit line BL, a voltage V22 (e.g., 2~2.5V) to the control line CL2, and the ground voltage (e.g., 0V) to the control line CL1. To write the second state (e.g., logic '0') of data at the programmable resistor R2 during the write time period, the memory controller 105 applies the ground voltage to the gate structure of the programmable resistor R2 instead of the voltage V22.

In an operation 1030, the memory controller 105 may read, during the read time period, data stored by the memory cell 125. The memory controller 105 may read data stored by the programmable resistors R1, R2 independently or separately. In one approach, to read data, the memory controller 105 may apply, during the read time period, a ground voltage (e.g., 0V) to the word line WL, and the ground voltage (e.g., 0V) to the bit line BL to disable the control transistor $T_{ctrl}$. When the control transistor $T_{ctrl}$ is disabled, the output node $N_{out}$ can be electrically decoupled from the bit line BL.

To read data stored by the programmable resistor R1, the memory controller 105 may apply, during the read time period, a voltage V32 (e.g., 1~2V) to the control line CL1, and the ground voltage (e.g., 0V) to the control line CL2, while the control transistor $T_{ctrl}$ is disabled. By applying the voltage V32 to the control line CL1 while applying the ground voltage to the control line CL2, the programmable resistor R1 may conduct current according to the resistance of the programmable resistor R1 while the programmable resistor R2 may not conduct current. For example, if the programmable resistor R1 has a high resistance (e.g., larger than 50 kΩ), then the current through the output node $N_{out}$ may be lower than the predetermined threshold. For example, if the programmable resistor R1 has a low resistance (e.g., less than 10 kΩ), then the current through the output node $N_{out}$ may be larger than the predetermined threshold. The memory controller 105 may sense current through the output node $N_{out}$ in response to the voltage V32 applied to the control line CL1 and determine a value of one bit data stored by the programmable resistor R1 according to the sensed current.

The memory controller 105 may read data stored by the programmable resistor R2 through the similar process. For example, the memory controller 105 may apply, during the read time period, the voltage V32 (e.g., 1~2V) to the control line CL2, and the ground voltage (e.g., 0V) to the control line CL1 while the control transistor $T_{ctrl}$ is disabled. The memory controller 105 may sense the current through the $N_{out}$ in response to the voltage V32 applied to the control line CL2, and determine a value of one bit data stored by the programmable resistor R2 according to the sensed current.

Advantageously, the memory cell 125 can be implemented in a compact form through a simple fabrication process. In one aspect, the programmable resistors R1, R2 and the control transistor $T_{ctrl}$ include components such as gate structures and source/drain structures for forming transistors (e.g., metal-oxide-semiconductor field effect transistor (MOSFET). By implementing the programmable resistors R1, R2 and the control transistor $T_{ctrl}$ by the same type of components, a fabrication process for forming a memory cell can be simplified. Moreover, each of the programmable resistors R1, R2 can store one bit data such that storage density can be improved. Furthermore, the programmable resistors R1, R2 can retain data without power, such that the memory cell 125 can operate as a non-volatile memory cell.

Figure 11:
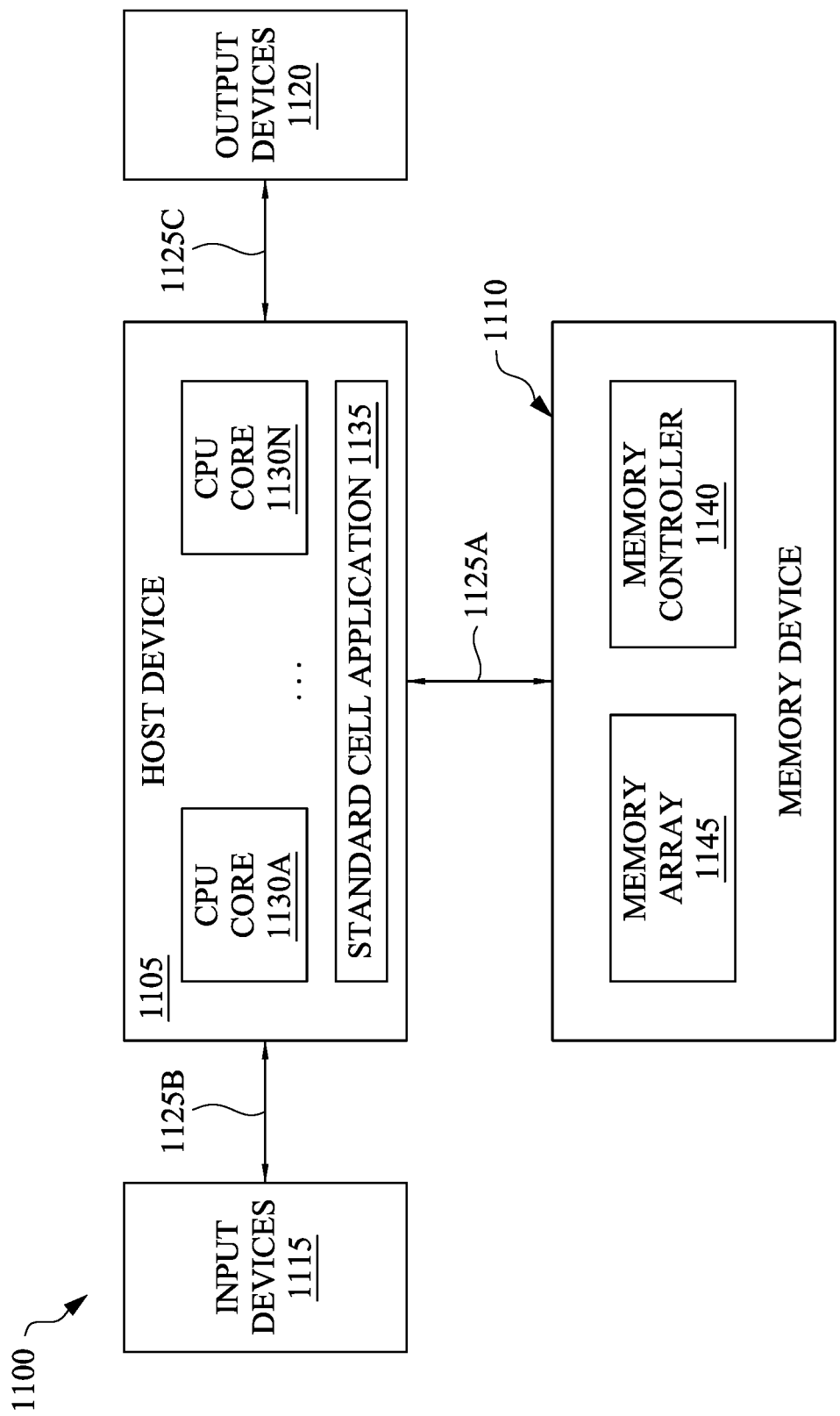
FIG. 11 is an example block diagram of a computing system, in accordance with some embodiments.

Referring now to FIG. 11, an example block diagram of a computing system 1100 is shown, in accordance with some embodiments of the disclosure. The computing system 1100 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1100 includes a host device 1105 associated with a memory device 1110. The host device 1105 may be configured to receive input from one or more input devices 1115 and provide output to one or more output devices 1120. The host device 1105 may be configured to communicate with the memory device 1110, the input devices 1115, and the output devices 1120 via appropriate interfaces 1125A, 1125B, and 1125C, respectively. The computing system 1100 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1105.

The input devices 1115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1105 and that allows an external source, such as a user (e.g., a circuit or layout designer), to enter information (e.g., data) into the host device and send instructions to the host device. Similarly, the output devices 1120 may include a variety of output technologies such as external memories, printers, speakers, displays, microphones, light emitting diodes, headphones, video devices, and any other output peripherals that are configured to receive information (e.g., data) from the host device 1105. The "data" that is either input into the host device 1105 and/or output from the host device may include any of a variety of textual data, circuit data, signal data, semiconductor device data, graphical data, combinations thereof, or other types of analog and/or digital data that is suitable for processing using the computing system 1100.

The host device 1105 includes or is associated with one or more processing units/processors, such as Central Processing Unit ("CPU") cores 1130A-1130N. The CPU cores 1130A-1130N may be implemented as an Application Specific Integrated Circuit ("ASIC"), Field Programmable Gate Array ("FPGA"), or any other type of processing unit. Each of the CPU cores 1130A-1130N may be configured to execute instructions for running one or more applications of the host device 1105. In some embodiments, the instructions and data to run the one or more applications may be stored within the memory device 1110. The host device 1105 may also be configured to store the results of running the one or more applications within the memory device 1110. Thus, the host device 1105 may be configured to request the memory device 1110 to perform a variety of operations. For example, the host device 1105 may request the memory device 1110 to read data, write data, update or delete data, and/or perform management or other operations. One such application that the host device 1105 may be configured to run may be a standard cell application 1135. The standard cell application 1135 may be part of a computer aided design or electronic design automation software suite that may be used by a user of the host device 1105 to use, create, or modify a standard cell of a circuit. In some embodiments, the instructions to execute or run the standard cell application 1135 may be stored within the memory device 1110. The standard cell application 1135 may be executed by one or more of the CPU cores 1130A-1130N using the instructions associated with the standard cell application from the memory device 1110. In one example, the standard cell application 1135 allows a user to utilize pre-generated schematic and/or layout designs of the memory system 100 or a portion of the memory system 100 to aid integrated circuit design. After the layout design of the integrated circuit is complete, multiples of the integrated circuit, for example, including the memory system 100 or a portion of the memory system 100 can be fabricated according to the layout design by a fabrication facility.

Referring still to FIG. 11, the memory device 1110 includes a memory controller 1140 that is configured to read data from or write data to a memory array 1145. The memory array 1145 may include a variety of volatile and/or non-volatile memories. For example, in some embodiments, the memory array 1145 may include NAND flash memory cores. In other embodiments, the memory array 1145 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1145 may be individually and independently controlled by the memory controller 1140. In other words, the memory controller 1140 may be configured to communicate with each memory within the memory array 1145 individually and independently. By communicating with the memory array 1145, the memory controller 1140 may be configured to read data from or write data to the memory array in response to instructions received from the host device 1105. Although shown as being part of the memory device 1110, in some embodiments, the memory controller 1140 may be part of the host device 1105 or part of another component of the computing system 1100 and associated with the memory device. The memory controller 1140 may be implemented as a logic circuit in either software, hardware, firmware, or combination thereof to perform the functions described herein. For example, in some embodiments, the memory controller 1140 may be configured to retrieve the instructions associated with the standard cell application 1135 stored in the memory array 1145 of the memory device 1110 upon receiving a request from the host device 1105.

It is to be understood that only some components of the computing system 1100 are shown and described in FIG. 11. However, the computing system 1100 may include other components such as various batteries and power sources, networking interfaces, routers, switches, external memory systems, controllers, etc. Generally speaking, the computing system 1100 may include any of a variety of hardware, software, and/or firmware components that are needed or considered desirable in performing the functions described herein. Similarly, the host device 1105, the input devices 1115, the output devices 1120, and the memory device 1110 including the memory controller 1140 and the memory array 1145 may include other hardware, software, and/or firmware components that are considered necessary or desirable in performing the functions described herein.

One aspect of this description relates to a memory cell. In some embodiments, the memory cell includes a first programmable resistor, a second programmable resistor, and a transistor. In some embodiments, the first programmable resistor includes a first gate structure electrically coupled to a first control line, and a shared source/drain structure. In some embodiments, the second programmable resistor includes a second gate structure electrically coupled to a second control line, and the shared source/drain structure. In some embodiments, the transistor includes i) a first source/drain structure electrically coupled to a bit line, ii) a third gate structure electrically coupled to a word line, and iii) a second source/drain structure electrically coupled to the shared source/drain structure of the first programmable resistor and the second source/drain structure of the second program resistor.

One aspect of this description relates to a memory system. In some embodiments, the memory system includes a memory cell and a memory controller coupled to the memory cell. In some embodiments, the memory cell includes a programmable resistor including a gate structure and a source/drain structure, and a control transistor coupled to the source/drain structure of the programmable resistor. In some embodiments, the memory controller is configured to apply a first voltage to the gate structure of the programmable resistor to set the programmable resistor to have a first resistance, while the control transistor is enabled. In some embodiments, the memory controller is configured to apply a second voltage lower than the first voltage to the gate structure of the programmable resistor to set the programmable resistor to have a second resistance higher than the first resistance, while the control transistor is enabled.

One aspect of this description relates to a memory cell. In some embodiments, the memory cell includes a first programmable resistor, a second programmable resistor, and a control transistor. In some embodiments, the first programmable resistor includes a first gate structure electrically coupled to a first control line, and a first source/drain structure electrically coupled to an output node. In some embodiments, the second programmable resistor includes a second gate structure electrically coupled to a second control line, and a second source/drain structure electrically coupled to the output node. In some embodiments, the control transistor includes a third source/drain structure electrically coupled to a bit line, a third gate structure electrically coupled to a word line, and a fourth source/drain structure electrically coupled to the output node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell comprising:
   a first programmable resistor comprising a first source/drain structure and presenting a first variable resistance state;
   a second programmable resistor comprising a second source/drain structure and presenting a second variable resistance state; and
   a control transistor comprising a third source/drain structure electrically coupled to an output node that is commonly connected to the first source/drain structure and the second source/drain structure, wherein
   the first programmable resistor further comprises a first floating source/drain structure that is electrically floating; and
   the second programmable resistor further comprises a second floating source/drain structure that is electrically floating.

2. The memory cell of claim 1, wherein
the first programmable resistor further comprises a first gate structure electrically coupled to a first control line;
the second programmable resistor further comprises a second gate structure electrically coupled to a second control line; and
the control transistor further comprises:
a third gate structure electrically coupled to a word line; and
a fourth source/drain structure electrically coupled to a bit line.

3. The memory cell of claim 2, wherein
the first programmable resistor further comprises a first dielectric layer disposed below the first gate structure; and
the second programmable resistor further comprises a second dielectric layer disposed below the second gate structure.

4. The memory cell of claim 3, wherein the first and second dielectric layers each include at least one of: TiN, $HfO_2$, or $SiO_2$.

5. The memory cell of claim 3, wherein the first dielectric layer presents the first variable resistance state, and the second dielectric layer presents the second variable resistance state.

6. The memory cell of claim 2, wherein the first gate structure and second gate structure are applied with different voltages through the first control line and second control line, respectively, when writing or reading the memory cell.

7. The memory cell of claim 1, wherein the first source/drain structure and second source/drain structure are formed as a single source/drain structure.

8. The memory cell of claim 7, further comprising an interconnect metal rail electrically coupling the single source/drain structure to the third source/drain structure.

9. The memory cell of claim 1, further comprising:
a third programmable resistor comprising a fifth source/drain structure and presenting a third variable resistance state;
wherein the fifth source/drain structure is also electrically coupled to the output node.

10. The memory cell of claim 9, wherein the third programmable resistor comprises a fourth gate structure electrically coupled to a third control line.

11. The memory cell of claim 10, the first gate structure, second gate structure, and third gate structure are applied with different voltages through the first control line, second control line, and third control line, respectively, when writing or reading the memory cell.

12. The memory cell of claim 9, wherein the first source/drain structure, second source/drain structure, and fifth source/drain structure are physically formed as different source/drain structures.

13. A memory cell comprising:
a first gate structure;
a first source/drain structure and a second source/drain structure disposed on opposite sides of the first gate structure;
a second gate structure;
a third gate structure;
a third source/drain structure disposed between the second and third gate structures, wherein the second gate structure is interposed between the first and third gate structures, with the second source/drain structure and the third source/drain structure disposed on opposite sides of the second gate structure;
a first dielectric layer disposed below the second gate structure and presenting a first variable resistance state; and
a second dielectric layer disposed below the third gate structure and presenting a second variable resistance state.

14. The memory cell of claim 13, wherein the first and second dielectric layers each include at least one of: TiN, $HfO_2$, or SiO.

15. The memory cell of claim 13, further comprising an interconnect metal rail electrically coupling the third source/drain structure to the second source/drain structure.

16. The memory cell of claim 15, wherein the interconnect metal rail is disposed above the first to third gate structures, and extends over the second gate structure.

17. The memory cell of claim 13, further comprising a shallow trench isolation structure having at least a portion interposed between the second gate structure and the second source/drain structure.

18. A memory cell comprising:
a first gate structure;
a first source/drain structure and a second source/drain structure disposed on opposite sides of the first gate structure;
a second gate structure;
a third gate structure;
a third source/drain structure disposed between the second and third gate structures, wherein the second gate structure is interposed between the first and third gate structures, with the second source/drain structure and the third source/drain structure disposed on opposite sides of the second gate structure;
a first dielectric layer disposed below the second gate structure and presenting a first variable resistance state;
a second dielectric layer disposed below the third gate structure and presenting a second variable resistance state; and
an interconnect metal rail electrically coupling the third source/drain structure to the second source/drain structure.

19. The memory cell of claim 18, wherein the first and second dielectric layers each include at least one of: TiN, $HfO_2$, or SiO.

20. The memory cell of claim 18, further comprising a shallow trench isolation structure having at least a portion interposed between the second gate structure and the second source/drain structure.

* * * * *